United States Patent
Xu et al.

(10) Patent No.: US 10,148,230 B2
(45) Date of Patent: Dec. 4, 2018

(54) ADAPTIVE DIGITAL PREDISTORTION FOR POLAR TRANSMITTER

(71) Applicant: Innophase, Inc., San Diego, CA (US)

(72) Inventors: Yang Xu, Chicago, IL (US); Sara Munoz Hermoso, San Diego, CA (US)

(73) Assignee: Innophase, Inc., San Diego, CA (US)

( * ) Notice: Subject to any disclaimer, the term of this patent is extended or adjusted under 35 U.S.C. 154(b) by 0 days.

(21) Appl. No.: 15/654,507

(22) Filed: Jul. 19, 2017

(65) Prior Publication Data

US 2018/0287569 A1    Oct. 4, 2018

Related U.S. Application Data

(60) Provisional application No. 62/477,998, filed on Mar. 28, 2017.

(51) Int. Cl.
| | |
|---|---|
| H04B 1/04 | (2006.01) |
| H03F 1/32 | (2006.01) |
| H04L 27/36 | (2006.01) |
| H03F 1/02 | (2006.01) |
| H03F 3/20 | (2006.01) |

(52) U.S. Cl.
CPC ......... *H03F 1/3282* (2013.01); *H03F 1/0261* (2013.01); *H03F 1/3247* (2013.01); *H03F 3/20* (2013.01); *H04L 27/361* (2013.01); *H03F 2200/451* (2013.01)

(58) Field of Classification Search
CPC ........... H03F 1/3282; H03F 2201/3227; H03F 2201/3233; H03F 1/3247
USPC ......... 455/114.3, 115.1, 114.2; 375/296, 295
See application file for complete search history.

(56) References Cited

U.S. PATENT DOCUMENTS

| | | | |
|---|---|---|---|
| 7,062,236 B2 | 6/2006 | Midtgaard | |
| 7,860,466 B2 | 12/2010 | Woo | |
| 7,869,543 B2 | 1/2011 | Reddy | |
| 8,351,876 B2 * | 1/2013 | McCallister | .......... H03F 1/3247 375/296 |
| 8,666,325 B2 | 3/2014 | Shute | |

(Continued)

OTHER PUBLICATIONS

W.-H. Yu, W.-F. Cheng, Y. Li, C.-F. Cheang, P.-I. Mak and R.P. Martins, "Low-complexity, full-resolution, mirror-switching digital predistortion scheme for polar-modulated power amplifiers", Electronics Letters Nov. 22, 2012 vol. 48 No. 24.

(Continued)

*Primary Examiner* — Sonny Trinh
(74) *Attorney, Agent, or Firm* — Invention Mine LLC

(57) ABSTRACT

A predistortion circuit receives an input polar signal to be transmitted, including an input amplitude signal and an input phase signal. The input polar signal is predistorted using at least one predistortion parameter selected from a lookup table. A phase-and-amplitude modulated radio-frequency signal is generated corresponding to the predistorted polar signal. A copy of the generated radio-frequency signal is provided to a polar receiver. The polar receiver is operated to generate, from the copy of the radio-frequency signal and without information relating to the generated transmit signal, a feedback polar signal including a feedback amplitude signal and a feedback phase signal. The feedback polar signal is compared to the input polar signal, the lookup table is updated in response to the comparison.

20 Claims, 9 Drawing Sheets

(56) References Cited

U.S. PATENT DOCUMENTS

| | | | |
|---|---|---|---|
| 8,682,315 B2* | 3/2014 | Mehta | H03F 1/3247 |
| | | | 455/114.1 |
| 9,391,625 B1 | 7/2016 | Xu | |
| 9,673,829 B1 | 6/2017 | Xu | |
| 2009/0054000 A1* | 2/2009 | Waheed | H04B 1/0475 |
| | | | 455/63.1 |
| 2017/0085405 A1 | 3/2017 | Xu | |

OTHER PUBLICATIONS

Calogero D. Presti, Donald F. Kimball, PeterM. Asbeck, "Closed-Loop Digital Predistortion System With Fast Real-Time Adaptation Applied to a Handset WCDMA PA Module", IEEE Transactions on Microwave Theory and Techniques, Vol. 60, No. 3, Mar. 2012.

* cited by examiner

ADAPTIVE DIGITAL PREDISTORTION FOR POLAR TRANSMITTER

CROSS REFERENCE TO RELATED APPLICATIONS

This application claims the benefit of U.S. Provisional Application No. 62/477,998 filed Mar. 28, 2017, entitled "ADAPTIVE DIGITAL PREDISTORTION FOR POLAR TRANSMITTER," reference of which is incorporated in its entirety.

BACKGROUND

Recent advances in high speed integrated circuit technologies enable various innovative and versatile applications relating to the Internet of Things (IoT). For many wireless communications applications, the power consumption of the transceiver is very important, especially if the transciever is battery powered.

Polar transmitters have been proposed as an energy-efficient solution for the generation of modulated radio-frequency signals. The use of efficient power amplifiers in such transmitters is desirable to minimize power consumption. However, selection of power amplifiers on the basis of minimal power consumption often entails tradeoffs in the form of increased nonlinearity in amplifier performance. Nonlinearities in power amplifier performance have been addressed using digital predistortion in the system of Presti, Calogero D., Donald F. Kimball, and Peter M. Asbeck. "Closed-loop digital predistortion system with fast real-time adaptation applied to a handset WCDMA PA module," *Microwave Theory and Techniques, IEEE Transactions on* 60.3 (2012): 604-618; and in the system of Yu, W-H., et al. "Low-complexity, full-resolution, mirror-switching digital predistortion scheme for polar-modulated power amplifiers," *Electronics Letters* 48.24 (2012): 1551-1553. Such systems, however, do not fully benefit from the efficiencies available through the integration of digital predistortion with polar transmitter technology.

SUMMARY

In a digital predistortion method according to some embodiments, a predistortion circuit receives an input polar signal to be transmitted, including an input amplitude signal and an input phase signal. The input polar signal is predistorted using at least one predistortion parameter selected from a lookup table. A phase-and-amplitude modulated radio-frequency signal is generated corresponding to the predistorted polar signal. A copy of the generated radio-frequency signal is provided to a polar receiver. The polar receiver is operated to generate, from the copy of the radio-frequency signal and without information relating to the generated transmit signal, a feedback polar signal including a feedback amplitude signal and a feedback phase signal. The feedback polar signal is compared to the input polar signal, the lookup table is updated in response to the comparison.

In some embodiments, the radio-frequency signal is amplified with a power amplifier using a selected power level. At least one of the predistortion parameters in the lookup table may be selected based in part on the selected power level.

In some embodiments, predistorting the input polar signal includes looking up an amplitude predistortion parameter corresponding to a value of the input amplitude signal and multiplying the input amplitude signal by the amplitude predistortion parameter.

In some embodiments, predistorting the input polar signal includes looking up a phase predistortion parameter corresponding to a value of the input amplitude signal and adding the phase predistortion parameter to the input phase signal.

In some embodiments, predistorting the input polar signal includes looking up an amplitude predistortion parameter corresponding to a value of the input amplitude signal and multiplying the input amplitude signal by the amplitude predistortion parameter to generate a predistorted amplitude signal. A phase predistortion parameter is then looked up corresponding to a value of the predistorted amplitude signal, and the phase predistortion parameter is added to the input phase signal.

In some embodiments, operating the polar receiver to generate the sampled phase signal includes dividing the frequency of the copied radio-frequency signal to generate a frequency-divided signal and providing the frequency-divided signal to a time-to-digital converter. The dividing of the frequency of the copied radio-frequency signal may include providing the copied radio-frequency signal to an injection-locked frequency divider.

In some embodiments, operating the polar receiver to generate the sampled phase signal includes normalizing an amplitude of the copied radio-frequency signal and measuring the phase of the normalized radio-frequency signal.

The comparison between the sampled polar signal and the input polar signal may be a comparison between the sampled polar signal and a delayed version of the input polar signal.

In some embodiments, comparing the sampled polar signal to the input polar signal includes subtracting the sampled phase signal from the input phase signal to determine a phase difference. In such embodiments, updating the lookup table may include adjusting an entry in the lookup table by an amount proportional to the phase difference.

In some embodiments, comparing the sampled polar signal to the input polar signal includes subtracting the sampled amplitude signal from the input amplitude signal to determine an amplitude difference. In such embodiments, updating the lookup table may include adjusting an entry in the lookup table by an amount proportional to the amplitude difference.

An exemplary digital predistortion circuit includes a lookup table having at least one address input and a data output, where the address input is connected to a polar signal input. The lookup table is operative to store a plurality of predistortion parameters. Predistortion logic is provided and has at least a first predistortion input connected to the polar signal input and a second predistortion input connected to the data output of the lookup table. The predistortion logic further has a predistortion output. A polar transmitter is provided with an input connected to the predistortion output. The polar transmitter has an RF output. A polar receiver is provided with an RF input coupled to the RF output of the polar transmitter. The polar receiver has a sampled polar signal output. An adaptation circuit has a first input connected to the sampled polar signal output of the polar receiver and a second input connected to the polar signal input. The adaptation circuit is operative to modify the stored predistortion parameters based on a comparison of the sampled polar signal output with the polar signal input.

In some embodiments, the predistortion output includes a predistorted amplitude output, and at least one of the address inputs of the lookup table is connected to the predistorted amplitude output.

In some embodiments, the polar receiver includes a phase detector and an envelope detector, and the phase detector includes amplitude normalization circuitry.

In some embodiments, the polar receiver includes a phase detector and an envelope detector, and the phase detector includes a frequency divider having a frequency-divided output and an input connected to the RF input of the polar receiver. In such embodiments, the polar receiver may further include a time-to-digital converter connected to the frequency-divided output and operative to determine a sampled phase signal from a phase of the frequency-divided output. In some such embodiments, the frequency divider is an injection-locked frequency divider, in other embodiments the frequency divider is a digital flip flop circuit or other digital divider circuit.

In some embodiments, the polar transmitter includes a power amplifier. The power amplifier may include a binary-to-thermometer decoder having a plurality of thermometer code outputs and a binary input connected to the predistortion output, with a plurality of power amplifier cells connected to respective thermometer code outputs. In some such embodiments, a power control circuit is provided with a power level output operative to control a drain voltage level applied to the plurality of power amplifier cells.

In some embodiments, the polar transmitter includes a power amplifier, and the circuit further comprises a power control circuit having a power level output operative to control a power level of the power amplifier, wherein the power level output is connected to at least one of the address inputs of the lookup table. Further embodiments may include a loop delay matching circuit connected between the polar signal input and the lookup table.

BRIEF DESCRIPTION OF THE DRAWINGS

The accompanying figures, where like reference numerals refer to identical or functionally similar elements throughout the separate views, together with the detailed description below, are incorporated in and form part of the specification, and serve to further illustrate embodiments of concepts that include the claimed invention, and explain various principles and advantages of those embodiments.

Figure 1:
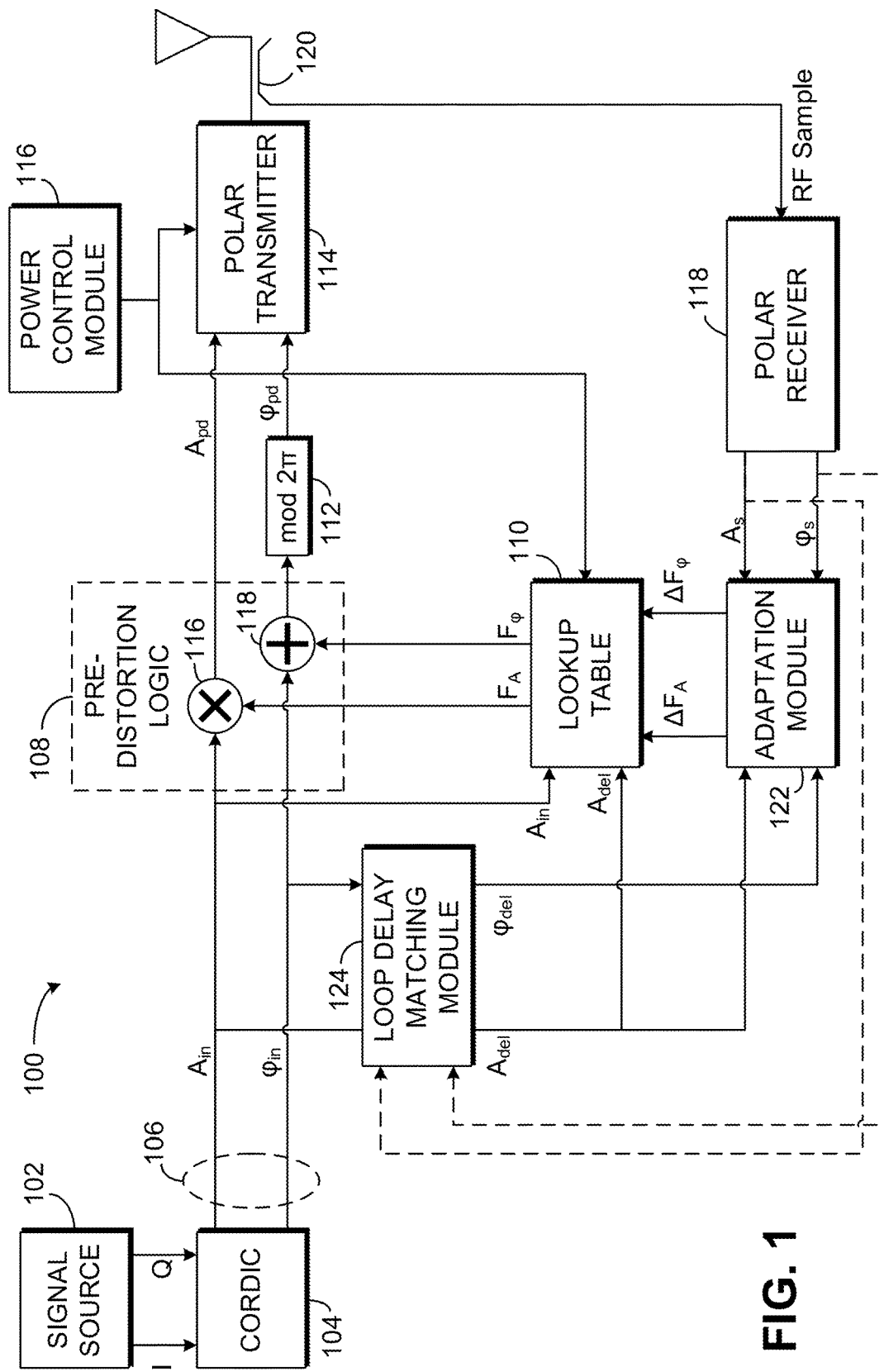
FIG. 1 is a schematic circuit diagram of a digital predistortion circuit for a polar transmitter according to an embodiment.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of embodiments of the present invention.

The apparatus and method components have been represented where appropriate by conventional symbols in the drawings, showing only those specific details that are pertinent to understanding the embodiments of the present invention so as not to obscure the disclosure with details that will be readily apparent to those of ordinary skill in the art having the benefit of the description herein.

DETAILED DESCRIPTION

Digital Predistortion Circuits

An exemplary digital predistortion circuit 100 for use with a polar transmitter is illustrated in FIG. 1. A signal source 102 is provided to generate in-phase (I) and quadrature (Q) values of a signal to be transmitted. Signal source 102 may be any source of I and Q values known to those of skill in the art, such as encoders for frequency modulated or phase-modulated radio-frequency signals, such as signals modulated using phase shift keying (PSK) or quadrature amplitude modulation (QAM). As the term is used in the present disclosure, phase-modulated signals include signals that are modulated in phase (e.g., binary phase-shift keying, quadrature phase-shift keying, 8-PSK, or 16-PSK) as well as signals that are modulated in both phase and amplitude (e.g., 16-QAM, 64-QAM, or 256-QAM). Frequency modulated signals include, among others, frequency shift keying (FSK) signals such as binary frequency-shift keying (BFSK) signals, multiple frequency-shift keying (MFSK) signals, and minimum-shift keying (MSK) signals.

The in-phase and quadrature signals from signal source 102 are provided to a coordinate rotation digital computer (CORDIC) logic circuit 104. The CORDIC logic circuit 104 converts the Cartesian I and Q signals to a corresponding polar signal that includes digital amplitude and phase signals. The amplitude signal $A_{in}$ and the phase signal $\varphi_{in}$ are provided through a polar signal input 106 to the digital predistortion circuit 100. The amplitude signal $A_{in}$ and the phase signal $\varphi_{in}$ are provided to predistortion logic 108. The predistortion logic 108 operates to distort the input polar signal to generate a predistorted polar signal. The predistortion performed by predistortion logic 108 is performed using at least one predistortion parameter selected from a lookup table 110. The predistorted phase signal may be passed through a modular division element 112 to keep the value of the phase between 0 and $2\pi$ (or, in some embodiments, between $-\pi$ and $+\pi$, among other alternatives). The predistorted values $A_{pd}$ of the amplitude and $\varphi_{pd}$ of the phase are provided to a polar transmitter 114. The polar transmitter 114 generates a phase-and-amplitude modulated radio-frequency (RF) output signal corresponding to the predistorted polar signal. In some embodiments, the radio-frequency signal, also referred to herein as a modulated carrier signal, has a frequency in the range of 2412 MHz-2484 MHz, although the use of the polar transmitter 114 is not limited to that frequency range.

In the embodiment of FIG. 1, the predistortion parameters from the lookup table are selected based the value of the input amplitude $A_{in}$ of the input polar signal. In some embodiments, the digital value of the input amplitude signal $A_{in}$ is truncated when it is provided to the lookup table such that only the most significant digits of the signal $A_{in}$ are used as an address value. Alternative techniques may also be used such that groups of contiguous values of the input amplitude signal $A_{in}$ map to a single address.

In some embodiments, the lookup table 110 includes two predistortion parameters for each value of the input amplitude signal: an amplitude predistortion parameter $F_A$ and a phase predistortion parameter $F_\varphi$. In the embodiment of FIG. 1, the predistorted amplitude signal $A_{pd}$ is generated by multiplying the input amplitude $A_{in}$ by the amplitude predistortion parameter $F_A$ using a multiplier 116, such that the predistorted amplitude signal $A_{pd}=A_{in}\times F_A$. In alternative embodiments, the amplitude predistortion parameter $F_A$ may be an additive parameter instead of a multiplicative parameter. In the embodiment of FIG. 1, the predistorted phase signal $\varphi_{pd}$ is generated by adding the parameter $F_\varphi$ to the input phase signal in using an adder 118, such that $\varphi_{pd}=\varphi_{in}+F_\varphi$.

In some embodiments, the power of the output of the polar transmitter 114 is variable and is controlled by a power control circuit 116. Different power levels may be selected for different transmission modes. An output of the power control circuit 116 may be used as a further address input to the lookup table 110. Thus, for a particular value of the input amplitude $A_{in}$, there may be different sets of the parameters $F_A$ and $F_\varphi$ for different power levels. This feature allows for accommodation of different nonlinearities at different power levels. In some embodiments, the power level is controlled by changing the drain voltage $V_{DD}$ supplied to the power amplifier, and the value provided to the lookup table may be a digital value representing the voltage $V_{DD}$.

In the embodiment of FIG. 1, the digital predistortion circuit 100 adaptively adjusts the parameters stored in the lookup table 110 in real time. To perform such adjustments, the digital predistortion circuit 100 includes a polar receiver 118. The polar receiver 118 receives through a coupler 120 a sample of the radio-frequency output of the polar transmitter 114. The polar receiver generates a sampled polar signal output that includes a sampled amplitude signal $A_s$ and a sampled phase signal $\varphi_s$ representing the amplitude and phase of the copied radio-frequency signal. Under ideal circumstances, wherein the predistortion parameters $F_A$ and $F_\varphi$ precisely counteract distortion introduced at the polar transmitter 114, the sampled polar signal $A_s$, $\varphi_s$ would be identical to the input polar signal $A_{in}$, $\varphi_{in}$, indicating a distortion-free radio-frequency output signal. In practice, however, the predistortion parameters $F_A$ and $F_\varphi$ do not precisely counteract distortion, and the sampled polar signal $A_s$, $\varphi_s$ is not identical to the input polar signal $A_{in}$, $\varphi_{in}$. Thus, predistortion circuit 100 includes an adaptation circuit 122 that operates to modify the stored predistortion parameters based on a comparison of the polar signal output with the polar signal input. Details of the adaptation circuit 122 are described in greater detail below, particularly with respect to FIG. 3.

In some embodiments, there is a non-negligible time delay between the time an input polar signal is received at the input 106 and the time at which the output signal has been sampled and provided to the adaptation circuit 122. To account for this time delay, the digital predistortion circuit 100 may be provided with a loop delay matching circuit 124. The loop delay matching circuit delays the digital input polar signal $A_{in}$, $\varphi_{in}$ to generate a delayed polar signal $A_{del}$, $\varphi_{in}$, including delayed input amplitude signal $A_{del}$ and delayed input phase signal $\varphi_{del}$. The duration of the delay introduced by the loop delay matching circuit 124 is selected such that the sampled polar signal $A_s$, $\varphi_s$ and the delayed polar signal $A_{del}$, $\varphi_{del}$ are synchronized with one another. In some embodiments, the loop delay matching circuit 124 receives the sampled polar signal $A_s$, $\varphi_s$ at a reference input. The loop delay matching circuit 124 automatically adjusts its delay to maximize the correlation between the sampled polar signal $A_s$, $\varphi_s$ and the digital input polar signal $A_{in}$, $\varphi_{in}$. In this way, the delay selected by the loop delay matching circuit 124 closely approximates the delay introduced as the signal propagates through the predistortion logic 108, the polar transmitter 114, and the polar receiver 118.

Figure 2:
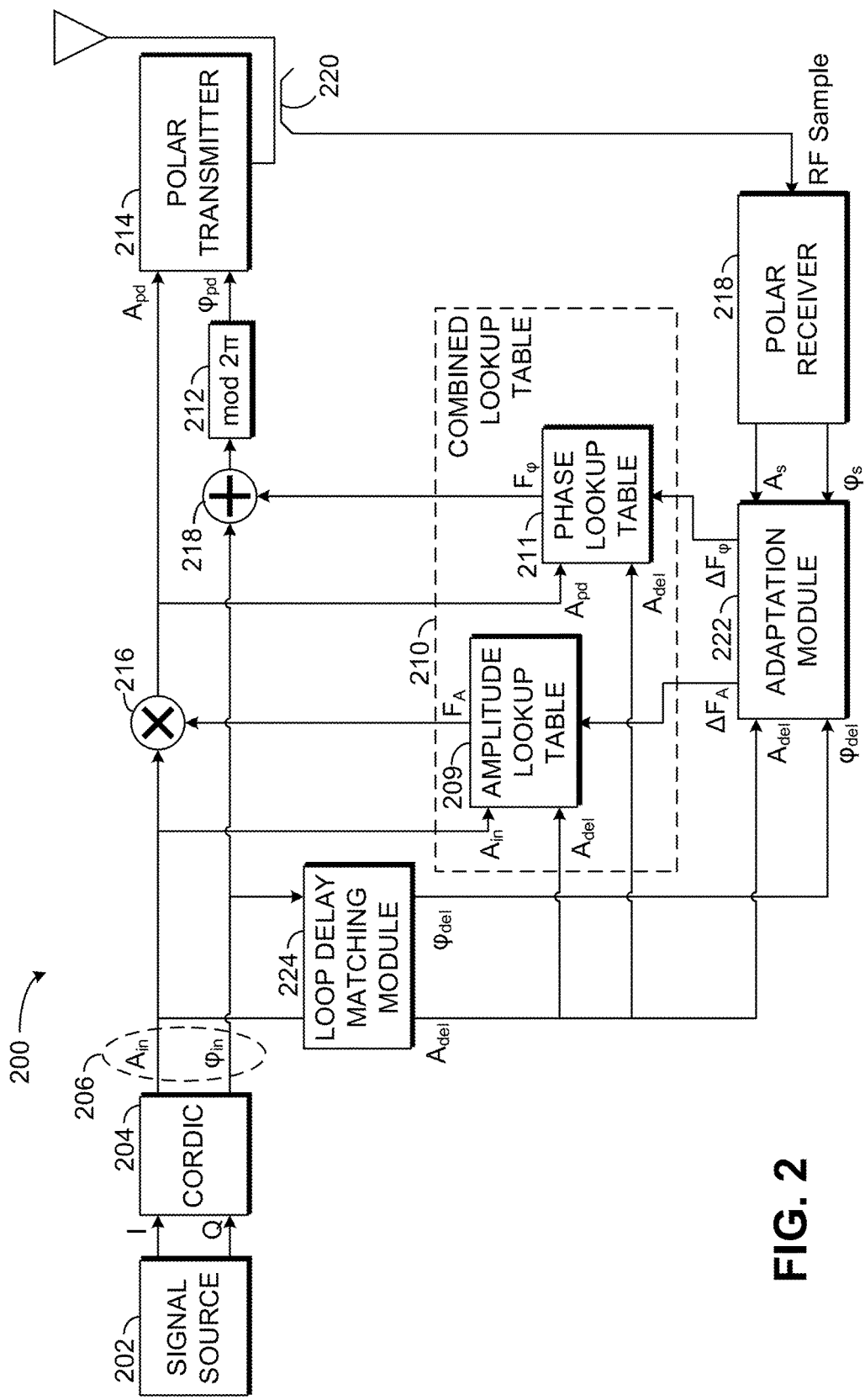
FIG. 2 is a schematic circuit diagram of a digital predistortion circuit for a polar transmitter according to another embodiment.

Another exemplary digital predistortion circuit 200 for use with a polar transmitter is illustrated in FIG. 2. A signal source 202 is provided to generate in-phase (I) and quadrature (Q) values of a signal to be transmitted. The in-phase and quadrature signals from signal source 202 are provided to a coordinate rotation digital computer (CORDIC) logic circuit 204. The CORDIC logic circuit 204 converts the Cartesian I and Q signals to a corresponding polar signal that includes digital amplitude and phase signals. The amplitude signal $A_{in}$ and the phase signal $\varphi_{in}$ are provided through a polar signal input 206 to the digital predistortion circuit 200. The amplitude signal $A_{in}$ and the phase signal $\varphi_{in}$ are provided to predistortion logic that includes a multiplier 216 and an adder 218. The multiplier 216 and adder 218 operate to distort the input polar signal to generate a predistorted polar signal. The predistortion performed by the multiplier 216 and adder 218 is performed using at least one predistortion parameter selected from a lookup table 210. As illustrated in FIG. 2, the lookup table 210 is a combined lookup table that includes a separate amplitude lookup table 209 and a phase lookup table 211. It should be understood that in different embodiments, predistortion parameters may be stored in the same lookup table or in separate lookup tables. Similarly, different lookup tables may be provided for different power levels, or parameters for all different power levels may be stored in the same lookup table.

The predistorted phase signal may be passed through a modular division element 212 to keep the value of the phase between 0 and a (or, in some embodiments, between $-\pi$ and $+\pi$, among other alternatives). The predistorted values $A_{pd}$ of the amplitude and $\varphi_{pd}$ of the phase are provided to a polar transmitter 214. The polar transmitter 214 generates a phase-and-amplitude modulated radio-frequency (RF) output signal corresponding to the predistorted polar signal.

In the embodiment of FIG. 2, the amplitude predistortion parameter $F_A$ from the amplitude lookup table 209 is selected based the value of the input amplitude $A_{in}$ of the input polar signal. A predistorted amplitude signal $A_{pd}$ is generated by multiplying the input amplitude $A_{in}$ by the amplitude predistortion parameter $F_A$ using multiplier 216, such that the predistorted amplitude signal $A_{pd}=A_{in}\times F_A$.

In the embodiment of FIG. 2, the phase predistortion parameter $F_\varphi$ from the phase lookup table 211 is selected based the value of the predistorted amplitude signal $A_{pd}$ (rather than the input amplitude $A_{in}$, as in the embodiment of FIG. 1). Embodiments in which the phase predistortion parameter is selected based on the input amplitude and embodiments in which the phase predistorted parameter is selected based on the predistorted amplitude are both contemplated to be within the scope of the present disclosure, among other variants. The predistorted phase signal $\varphi_{pd}$ is generated by adding the parameter $F_\varphi$ to the input phase signal $\varphi_{in}$ using adder 218, such that $\varphi_{pd}=\varphi_{in}+F_\varphi$.

It is to be understood that the embodiment of FIG. 2 may also include a polar transmitter 214 with a variable power output controlled by a power control circuit. Moreover, the power level may serve as a further addressing input to one or more of the lookup tables 209, 211.

In the embodiment of FIG. 2, the digital predistortion circuit 200 adaptively adjusts the parameters stored in the lookup tables 209, 211 in real time. To perform such adjustments, the digital predistortion circuit 200 includes a polar receiver 218. The polar receiver 218 receives through a coupler 220 a sample of the radio-frequency output of the polar transmitter 214. The polar receiver 218 generates a sampled polar signal output that includes a sampled amplitude signal $A_s$ and a sampled phase signal $\varphi_s$ representing the amplitude and phase of the copied radio-frequency signal. Predistortion circuit 200 includes an adaptation circuit 222 that operates to modify the stored predistortion parameters based on a comparison of the polar signal output with the polar signal input. Details of the adaptation circuit 222 are described in greater detail below, particularly with respect to FIG. 3.

The digital predistortion circuit 200 may be provided with a loop delay matching circuit 224. The loop delay matching circuit delays the digital input polar signal $A_{in}$, $\varphi_{in}$ to generate a delayed polar signal $A_{del}$, $\varphi_{del}$, including delayed input amplitude signal $A_{del}$ and delayed input phase signal $\varphi_{del}$. The duration of the delay introduced by the loop delay matching circuit 224 is selected such that the sampled polar signal $A_s$, $\varphi_s$ and the delayed polar signal $A_{del}$, $\varphi_{del}$ are synchronized with one another. In some embodiments, the loop delay matching circuit 224 receives the sampled polar signal $A_s$, $\varphi_s$ at a reference input. The loop delay matching circuit 224 automatically adjusts its delay to maximize the correlation between the sampled polar signal $A_s$, $\varphi_s$ and the digital input polar signal $A_{in}$, $\varphi_{in}$. In this way, the delay selected by the loop delay matching circuit 124 closely approximates the delay introduced as the signal propagates through the predistortion logic 208, the polar transmitter 214, and the polar receiver 218.

Adaptation Circuit.

Figure 3:
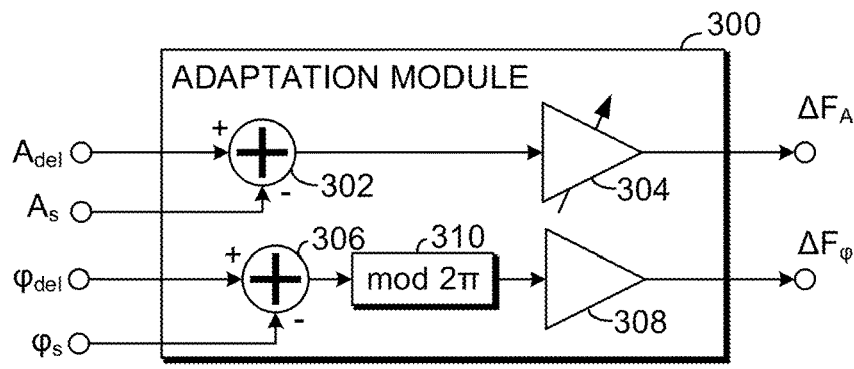
FIG. 3 is a schematic circuit diagram of an adaptation circuit for use with a digital predistortion circuit according to an embodiment.

FIG. 3 is a circuit diagram of an exemplary adaptation circuit 300, which may be used as, for example, the adaptation circuit 122 of FIG. 1 or the adaptation circuit 222 of FIG. 2. The adaptation circuit 300 has inputs for receiving the sampled polar signal $A_s$, $\varphi_s$ and the delayed version $A_{del}$, $\varphi_{del}$ of the input polar signal $A_{in}$, $\varphi_{in}$. At digital adder 302, the adaptation circuit subtracts the sampled amplitude signal $A_s$ from the delayed input amplitude signal $A_{in}$ to determine an amplitude difference. The amplitude difference may be digitally scaled at buffer 304. In some embodiments, the scaling factor employed at the buffer 304 is itself a function of the input amplitude $A_{in}$. The scaled amplitude difference, referred to as the value $\Delta F_A$, is used to adjust the value $F_A$ in the lookup table that corresponds to the amplitude $A_{in}$. For example, the value $F_A$ corresponding to input amplitude $A_{in}$ may be adjusted by addition of the value $\Delta F_A$.

At digital adder 306, the adaptation circuit subtracts the sampled phase signal $\varphi_s$ from the delayed input phase signal $\varphi_{del}$ to determine a phase difference. A modular divider 310 operates to keep the phase difference within a $2\pi$ range. The phase difference may be digitally scaled at buffer 308. The scaled phase difference, referred to as the value $\Delta F_\varphi$, is used to adjust the value $F_\varphi$ in the lookup table that corresponds to the amplitude $A_{in}$ (or $A_{pd}$, in some embodiments). For example, the value $F_\varphi$ corresponding to input amplitude $A_{in}$ (or $A_{pd}$) may be adjusted by addition of the value $\Delta F_\varphi$.

Polar Receivers.

Figure 4:
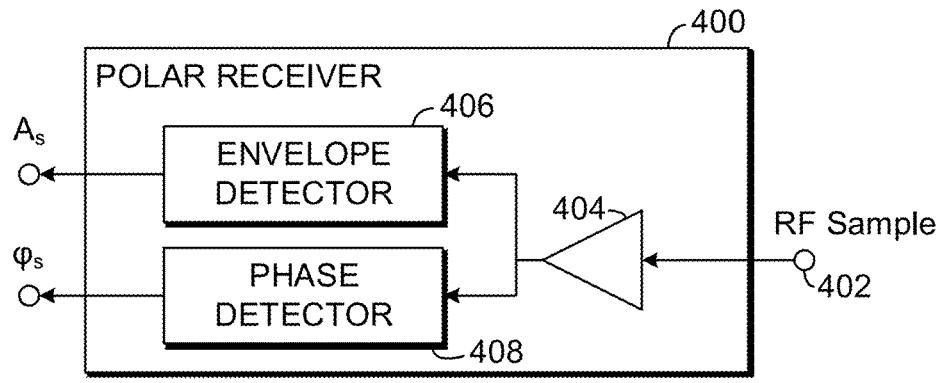
FIG. 4 is a schematic circuit diagram of a polar receiver for use with a digital predistortion circuit according to an embodiment.

Various different types of polar receiver may be used in digital predistortion circuitry disclosed herein. An overview of an exemplary polar receiver architecture is illustrated in FIG. 4. In the example of FIG. 4, a polar receiver 400 has an input 402 for a copied radio frequency signal. The copied radio frequency signal is provided by a buffer 404 to an envelope detector 406 and a phase detector 408. The envelope detector 406 measures the amplitude of the copied radio frequency signal and outputs a digital representation of that amplitude as signal $A_s$. The phase detector 408 measures the phase of the copied radio frequency signal and outputs a digital representation of that phase as signal $\varphi_s$. Several different types of envelope detector and phase detector may be employed in embodiments disclosed herein. Some specific examples of phase detection circuits are given below.

Figure 5:
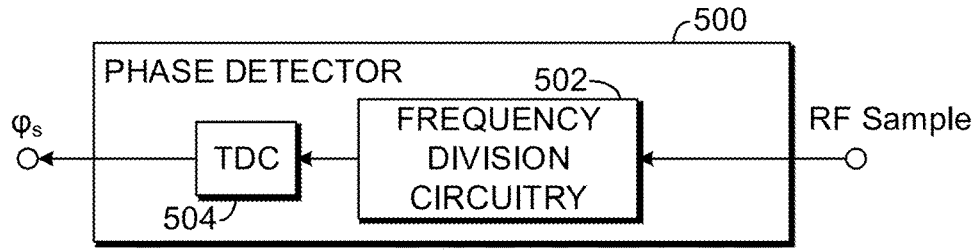
FIG. 5 is a schematic circuit diagram of a phase detector component of a polar receiver for use with a digital predistortion circuit according to an embodiment.

The architecture of an exemplary phase detector 500 is illustrated in FIG. 5. The phase detector 500 uses frequency division circuity 502 to divide the frequency of the input radio frequency signal. The frequency division circuitry 502 may include one or both of digital frequency division circuitry and analog frequency division circuitry. A frequency-divided output of the frequency division circuitry is provided to a time-to-digital converter (TDC) 504. The time-to-digital converter detects the phase of the frequency-divided signal, which in turn provides a digital representation of the phase of the initial input radio frequency signal.

Figure 6:
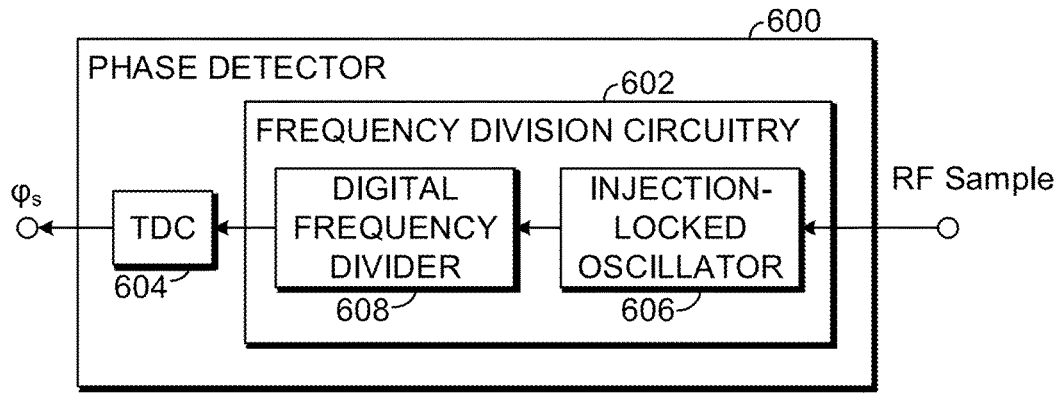
FIG. 6 is another schematic circuit diagram of a phase detector component of a polar receiver for use with a digital predistortion circuit according to an embodiment.

As illustrated in greater detail in FIG. 6, some embodiments of the phase detector 600 include frequency division circuitry 602. This frequency division circuitry 602 includes an injection-locked oscillator (ILO) 606 operating as an injection-locked frequency divider by locking onto a harmonic of the injected signal (such as a second harmonic at half frequency, or a fourth harmonic at one fourth the frequency of the injected signal). In alternative embodiments, the ILO locks on the fundamental frequency (and is not divided) if the modulated carrier signal is low enough to be processed directly. The injection-locked oscillator 606 may be in the form of a ring oscillator (e.g., a serially and circularly connected set of inverters or buffers that cause a pulse to propagate around the ring) or an inductor-capacitor resonant (LC) tank circuit, and further operates as amplitude normalization circuitry, in that the amplitude of the frequency-divided signal provided by the injection-locked oscillator 606 is substantially independent of fluctuations of the amplitude of the input. In some embodiments the frequency-divided, amplitude-normalized copied radio frequency signal is then provided to a digital frequency divider 608, which may be a programmable-modulus frequency divider. The output of the frequency division stages is provided to the time-to-digital converter 604, which in turn provides a digital output signal $\varphi_s$ representing the phase of the sampled digital signal. The frequency divider may be used to reduce the frequency to a range that may be more easily processed.

Figure 7:
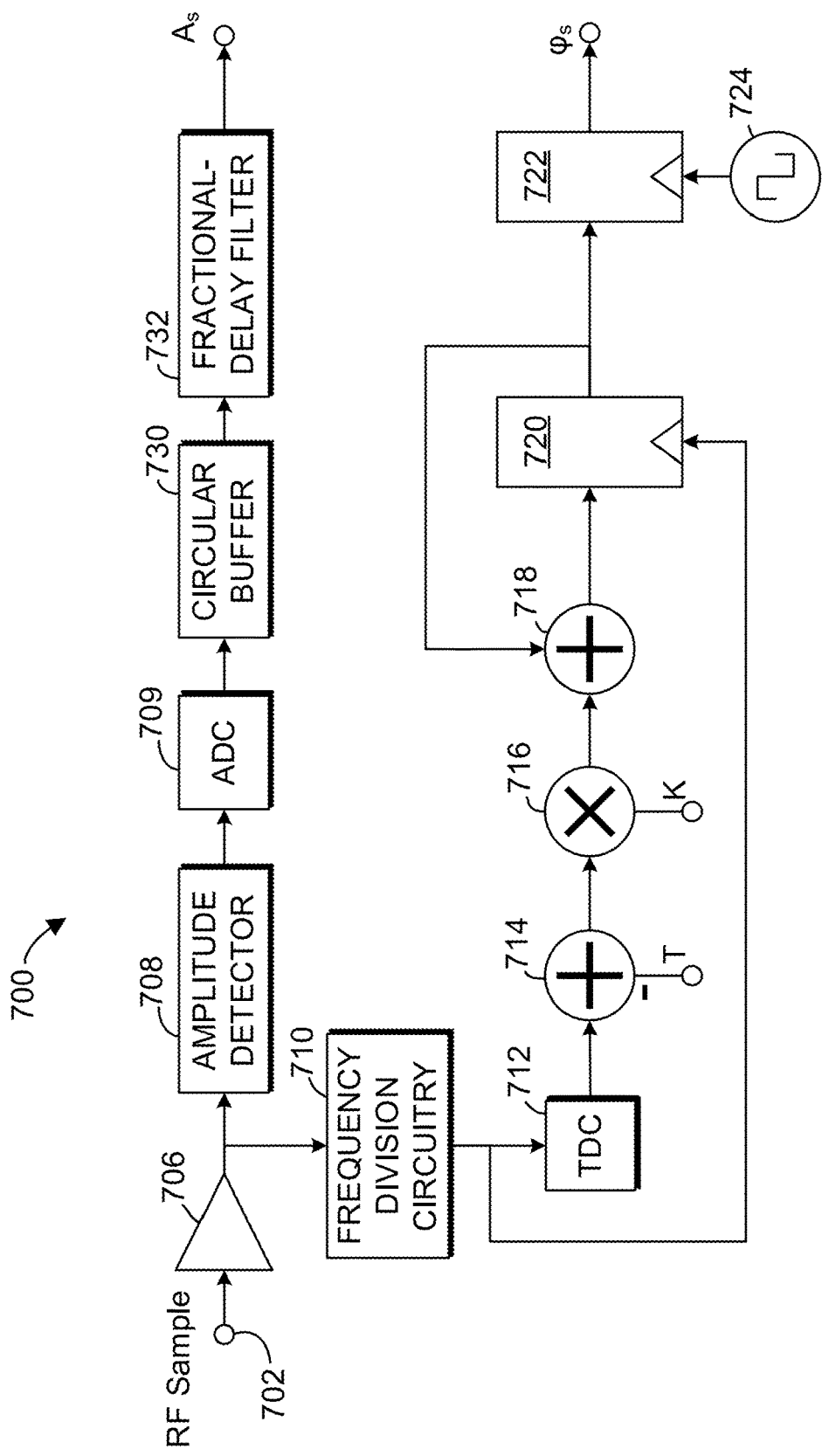
FIG. 7 is a schematic circuit diagram of a polar receiver for use with a digital predistortion circuit according to an embodiment.

A further example of a polar receiver is illustrated in FIG. 7. In the example of FIG. 7, a polar receiver 700 receives a copied radio-frequency (RF) signal through an input node 702, which may be connected to a coupler such as couplers 120, 220. The copied radio-frequency signal is provided to a buffer 706, which may amplify the signal. The polar receiver 700 operates to receive and decode frequency modulated or phase-modulated radio-frequency signals, such as signals modulated using phase shift keying (PSK) or quadrature amplitude modulation (QAM).

The polar receiver 700 includes an amplitude detector 708 such as an envelope detector or a product detector, which operates to provide a signal representing the amplitude of the modulated radio-frequency signal. The amplitude detector 708 may operate using various techniques such as, for example, signal rectification followed by low-pass filtering. The signal representing the amplitude of the modulated radio-frequency signal is converted to a digital form with an analog-to-digital converter (ADC) 709. The ADC operates to generate a series of digital amplitude signals representing the amplitude of the copied radio-frequency signal. In some embodiments, ADC 709 samples the amplitude of the modulated radio-frequency signal at 160 Msps.

The polar receiver 700 is provided with frequency division circuitry 710. The frequency division circuitry has an input for receiving the copied radio-frequency input signal from the buffer 706 and a frequency-divided output for providing a frequency-divided output signal to a trigger input of a time-to-digital converter (TDC) 712. The frequency division circuitry operates to divide the frequency of the input signal by a frequency divisor. In some embodiments, the frequency division circuitry can be implemented using a harmonic injection-locked oscillator, a digital frequency divider, or a combination thereof, among other possibilities. The frequency division circuitry 710 also acts as an amplitude normalization circuit.

The time-to-digital converter 712 operates to measure a characteristic time of the frequency-divided signal, such as the period of the frequency-divided signal. The time-to-digital converter 712 may operate to measure the period of the frequency-divided signal by measuring an elapsed time between successive corresponding features of the frequency-divided signal. For example, the time-to-digital converter may measure the period of the frequency-divided signal by measuring a time between successive rising edges of the frequency-divided signal or the time between successive falling edges of the frequency-divided signal. In alternative embodiments, the time-to-digital converter may measure a characteristic time other than a complete period, such as an elapsed time between a rising edge and a falling edge of the frequency-divided signal.

In some embodiments, the time-to-digital converter 712 operates without the use of an external trigger such as a clock signal. That is, the time-to-digital converter 712 measures the time between two features (e.g., two rising edges) of the frequency-divided signal rather than the time between an external trigger signal and a rising edge of the frequency-divided signal. Because the start and end of the time period measured by the time-to-digital converter 712 are both triggered by the frequency-divided signal, rather than an external clock signal, the time-to-digital converter 712, is referred to herein as a self-triggered time-to-digital converter. In a further embodiment, the TDC may measure features (i.e., rising edges, or falling edges) of the modulated signal with respect to an internal reference clock. In this manner, the phase of the received signal may be made with respect to the internal timing signal. Frequency offsets between the received modulated signal (after frequency division, when present) may be accounted for by repeatedly removing a time increment equal to predetermined difference in period between the internal reference and the received modulated signal.

In the example of FIG. 7, the time-to-digital converter 712 provides a digital time output that represents the period of the frequency-divided output signal. The digital time output is provided to a digital subtractor 714. The digital subtractor 714 operates to subtract a period offset value T from the digital time output, thereby generating an offset digital time output signal. The period offset value may be a constant value corresponding to an expected period of the frequency-divided signal in an unmodulated state, which may be expressed in native units used by the time-to-digital converter. For example, where the frequency of the frequency-divided signal is expressed by $f_d$, the period offset value T can be expressed by $$T = \frac{1}{f_d \cdot LSB}$$

where LSB is the amount of time represented by the least significant bit of the time-to-digital converter. The offset digital time output is thus at or near zero when no shift is occurring in the phase of the frequency-divided signal.

When a phase shift does occur in the copied radio-frequency signal (a phase-modulated or frequency modulated carrier signal), this results in a temporary change in the period of the copied radio-frequency signal, which in turn causes a temporary change in the period of the frequency-divided signal. This temporary change in the period of the frequency-divided signal is measured as a temporary change in the digital time output (and in the offset digital time output). In some embodiments, the offset digital time output is at or near zero during periods when the phase of the modulated radio-frequency signal remains steady, while a shift in the phase of the modulated radio-frequency signal results in the offset digital time output signal briefly taking on a positive or negative value, depending on the direction of the phase shift.

In some embodiments, the receiver 700 includes a digital multiplier 716. The multiplier 716 operates to multiply the offset digital time output by a scale factor K to generate a scaled digital time signal. The scale factor K may be used for example, to convert the offset digital time output signal to a scaled digital time signal that represents an angle (expressed, e.g. in radians) corresponding to a shift in the phase of the original modulated radio-frequency signal. To that end, the scale factor K may be selected as $$K = -2\pi f_c LSB$$

where $f_c$ is the frequency of the modulated radio-frequency signal (e.g, a frequency between 2412 MHz and 2484 MHz).

The offset digital time output signal (which may have been scaled in some embodiments) is provided to a digital integrator, implemented in polar receiver 700 using a digital adder 718 and a register 720. The digital integrator generates an integrated time signal. The register 720 may be clocked using the frequency-divided signal, resulting in one addition per cycle of the frequency-divided signal. In embodiments in which the offset digital time output signal represents a change in the phase of the copied radio-frequency signal, the integrated time signal provides a value that represents the current phase of the copied radio-frequency signal.

In polar receiver 700, the integrated time signal is sampled using a register 722, which may be clocked by a clock source 724. In some embodiments, the register 722 operates to sample the integrated time signal at 160 Msps, although other sampling rates may alternatively be used. In the embodiment of FIG. 7, frequency division circuitry 710, TDC 712, subtractor 714, multiplier 716, adder 718, and registers 720 and 722 operate as a phase detection circuit operative to generate a series of digital phase signals representing the phase of the sampled signal.

In some embodiments, the operation of the phase detection circuitry requires a greater number of processing cycles than the operation of the amplitude detection circuitry. In such embodiments, the polar receiver 700 includes componentry operative to align the signals from the amplitude detection circuitry and the phase detection circuitry, such that a digital signal representing the amplitude of the modulated signal at a particular time is paired with a digital signal representing the phase of the modulated signal at substantially the same time. In the embodiment of FIG. 7, such componentry includes a circular buffer 730 and fractional delay filter 732. In some embodiments, the delays introduced by the circular buffer 730 and the fractional delay filter 732 are adjusted adaptively, as described in greater detail in, U.S. patent application Ser. No. 14/863,174, filed Sep. 23, 2015, entitled "METHOD AND APPARATUS FOR POLAR RECEIVER WITH PHASE-AMPLITUDE ALIGNMENT," the entire disclosure of which is incorporated herein by reference.

Figure 8:
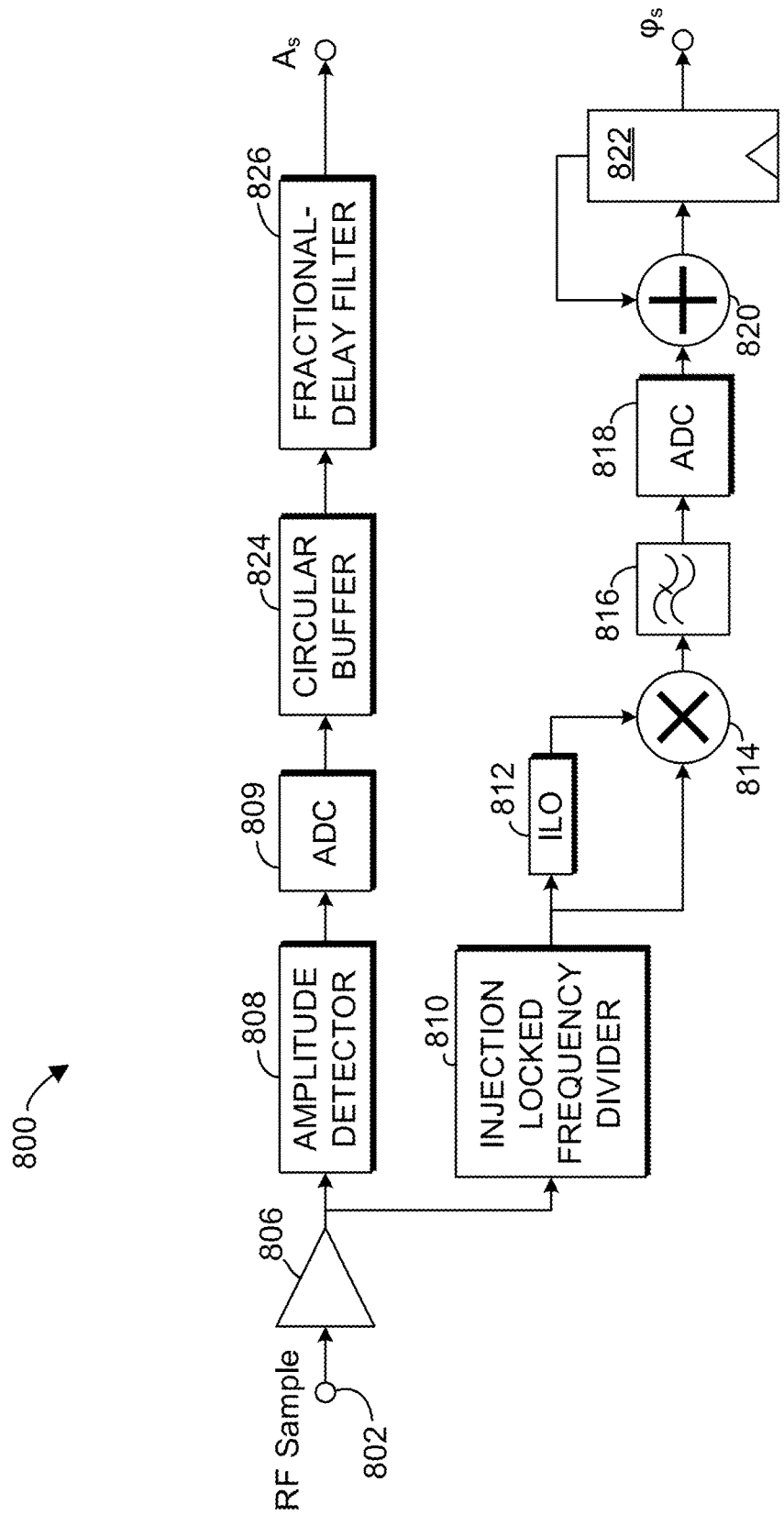
FIG. 8 is a schematic circuit diagram of another polar receiver for use with a digital predistortion circuit according to an embodiment.

An alternative example of a polar receiver for use as polar receiver 118, or 218 is illustrated in FIG. 8. In the example of FIG. 8, polar receiver 800 receives copied radio-frequency (RF) signal through an input node 802, which may be connected to a coupler such as coupler 120 or 220. The copied radio-frequency signal is provided to a buffer 806.

The polar receiver 800 includes an amplitude detector 808 such as an envelope detector or a product detector, which operates to provide a signal representing the amplitude of the copied radio-frequency signal. The amplitude detector 808 may operate using various techniques such as, for example, signal rectification followed by low-pass filtering. The signal representing the amplitude of the copied radio-frequency signal is converted to a digital form with an analog-to-digital converter (ADC) 809. The ADC operates to generate a series of digital amplitude signals representing the amplitude of the modulated radio-frequency signal. In some embodiments, ADC 809 samples the amplitude of the copied radio-frequency signal at 160 Msps. In some embodiments, the amplitude signals may be sampled at 80 Msps or at another rate.

The polar receiver 800 includes an injection-locked frequency divider 810, which may be a second-harmonic injection-locked oscillator (ILO). The output of the injection locked frequency divider is phase compressed, in the sense that a phase shift of φ at an input frequency f corresponds to a phase shift of φ/N at the divided output frequency f/N. The output of the frequency divider 810 is also amplitude normalized. The phase-compressed output signal of the injection-locked frequency divider 810 is provided to an injection-locked oscillator 812, which is tuned to the divided output frequency f/N. The injection locked oscillator 812 operates such that a phase shift in the phase-compressed output signal leads, after a characteristic delay period, to a corresponding phase shift in the output of the injection-locked oscillator 812. The phase-compressed signal from frequency-divider 810 and the delayed phase-compressed signal from the injection locked oscillator 812 are combined at mixer 814, and the product is filtered by low-pass filter 816. The paths from frequency divider 810 and injection locked oscillator 812 to the mixer 814 are selected such that, in a steady state, the phase-compressed signal and the delayed low-pass signal have a phase difference of π/2. This phase difference may be implemented using, for example, one or more delay elements (not shown in FIG. 8). At the steady-state phase difference of π/2, the output of the low-pass filter 816 is substantially zero. However, any phase change in the input signal propagates more slowly through ILO 812, than it does along the path from frequency divider 810 to mixer 814. This leads to a temporary departure from π/2 in the phase difference at the inputs to mixer 814, resulting in a non-zero signal at the output of low-pass filter 816. This analog signal represents the rate of phase change. In an exemplary embodiment, this signal is digitized by analog to digital converter 818, and the result may be integrated by adder 820 and register 822 to provide a digital signal representing the phase of the modulated signal. The operation of the phase detection circuitry used in FIG. 2 may further be understood with reference to U.S. Pat. No. 9,083,588 (issued Jul. 14, 2015), the specification of which is incorporated herein by reference in its entirety.

In addition to the phase measurement circuitry illustrated in the polar receivers of FIGS. 7 and 8, alternative techniques may be used to measure the phase of the sampled input signal. For example, a phase-locked loop may be used to lock on to the phase of the sampled signal. An error signal output by the phase-locked loop may then be used to represent a rate of change of the phase of the sampled signal, and that rate of change can be digitized and integrated to generate a series of digital signals representing the phase of the sampled signal.

In the polar receiver of FIG. 8, the series of digital amplitude signals representing the amplitude of the modulated signal is provided to a circular buffer 824 for coarse alignment and to fractional delay filter 826 for fine alignment with the series of digital phase signals representing the phase of the modulated signal. The fractional delay filter 826 may be a finite impulse response filter using coefficients selected from a lookup table. These coefficients may be selected to implement a variable delay selected by a controller.

Figure 9:
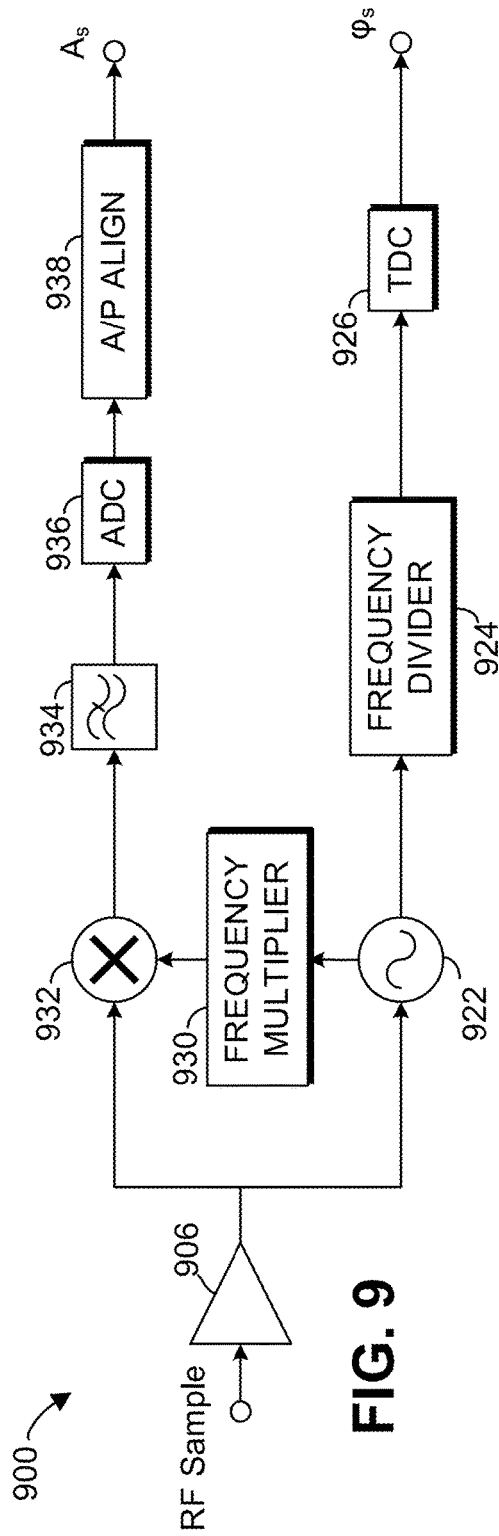
FIG. 9 is a schematic circuit diagram of a further polar receiver for use with a digital predistortion circuit including digital predistortion according to an embodiment.

An exemplary polar receiver 900 according to some embodiments is illustrated in FIG. 9. A phase-modulated radio-frequency sample signal is received from a coupler at an input node and provided to a buffer 906, which provides impedance matching to the coupler.

In the embodiment of FIG. 9, the polar receiver 900 is provided with an injection-locked oscillator (ILO) 922 for use in phase detection. The injection-locked oscillator 922 may be, for example, an injection locked ring oscillator divider provided with a plurality of injection points. Which set of injection points is used for a particular input signal may be determined based on the frequency of the input signal. Depending on the frequency of the input signal, the set of injection points used may consist of a single injection point, a plurality of injection points, or all injection points. The use of an injection-locked ring oscillator in a polar receiver is described in greater detail in U.S. patent application Ser. No. 14/957,134, filed Dec. 2, 2015, entitled "WIDEBAND POLAR RECEIVER ARCHITECTURE AND SIGNAL PROCESSING METHODS," the entire disclosure of which is incorporated herein by reference.

When no signal is being injected, the injection-locked oscillator 922 oscillates at a free-running frequency. In some embodiments, the injection-locked oscillator 922 is a tunable injection-locked oscillator with an adjustable free-running frequency. The injection-locked oscillator 922 is operable to lock onto an input signal when the frequency of the input signal, divided by an integer N (with N≥1), is within a locking range of the oscillator for at least some value of N. Expressed differently, the oscillator is able to lock when the frequency of the input signal is an Nth harmonic of a frequency within the locking range of the oscillator, for at least some value of N. It should be noted that the locking range of the oscillator may vary when the oscillator is tuned, the locking range may be different for different harmonics, and the locking range may be affected by the amplitude of the injected input signal. Thus, the locking range of the oscillator is interpreted in light of other relevant parameters. When the oscillator 922 is locked onto a harmonic input signal, it functions as an injection-locked frequency divider. When the oscillator 922 is locked onto an Nth harmonic input signal at frequency $f_{in}$, the oscillator output signal has a frequency font that is substantially equal to $f_{in} \div N$. Phase shifts in the input signal introduce corresponding phase shifts in the oscillator output signal, with a phase shift of φ in the input signal being reflected by a phase shift of φ÷N in the output signal. The frequency division helps to enable phase detection on the incoming signal: using oscillator 922 as an injection-locked frequency divider, together, in some embodiments, with an additional frequency divider or dividers 924, brings the frequency of the signal low enough such that phase shifts can be detected with a time-to-digital converter (TDC) 926 or other componentry. The additional frequency divider 924 can be implemented using a harmonic injection-locked oscillator, a digital frequency divider, or a combination thereof, among other possibilities. Phase detection using a time-to-digital converter can be performed using, among other techniques, the techniques described in U.S. patent application Ser. No. 14/634,525, entitled "Method and Apparatus for Polar Receiver with Digital Demodulation," filed Feb. 27, 2015, the entire disclosure of which is incorporated herein by reference.

As noted above, the injection-locked oscillator 922 operates to divide the frequency of the input signal by a selected value of N when the input signal is the Nth harmonic of the oscillator output signal. In the embodiment of FIG. 9, a frequency multiplier 930 is provided and operates to multiply the oscillator output signal by the selected factor N, which results in a signal with the same frequency as that of the sampled input signal. The injection-locked oscillator 922 and the frequency multiplier 930 together operate as amplitude normalization circuitry by removing amplitude variations from the input signal. The output of the frequency multiplier 930 is thus an amplitude-normalized replica of the input signal. The amplitude-normalized replica signal is provided to a mixer 932, such as a Gilbert cell, that multiplies the amplitude-normalized replica signal by the (possibly amplitude-modulated) sampled signal. The product of the amplitude-normalized replica signal is a mixed signal that has a low frequency (or DC) component proportional to the amplitude of the copied radio-frequency signal. A low-pass filter 934 filters out high-frequency components of the mixed signal, leaving an analog signal proportional to the amplitude of the sampled signal. An analog to digital converter (ADC) 936 generates a digital signal that represents the amplitude of the input signal. In some embodiments, ADC 136 samples the amplitude of the modulated radio-frequency signal at 160 Msps. The digital phase information from TDC 926 and the digital amplitude information from ADC 936 are aligned by A/P alignment circuitry 938.

Although particular examples of polar receiver architectures have been described above, it should be understood that other types of polar receiver may be used in the digital predistortion circuitry according to embodiments disclosed herein.

Polar Transmitters.

Figure 10:
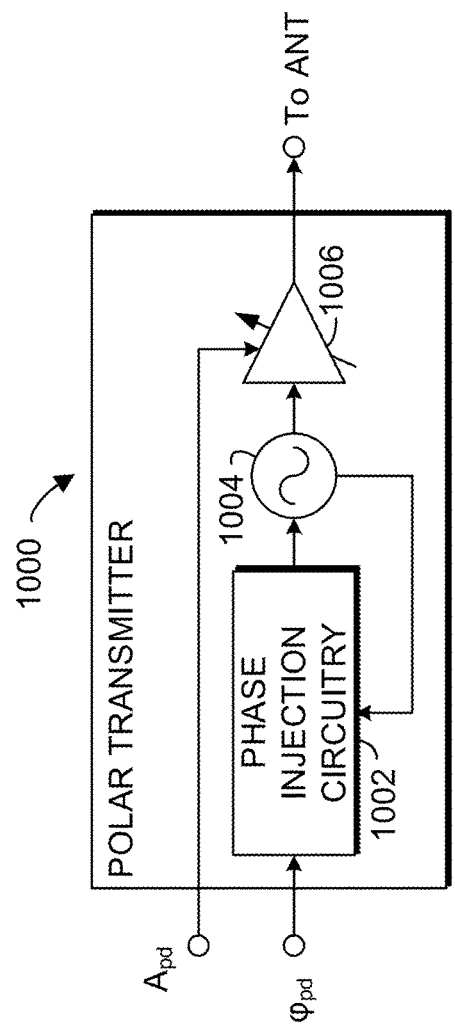
FIG. 10 is a schematic circuit diagram of a polar transmitter for use with a digital predistortion circuit according to an embodiment.

An exemplary polar transmitter architecture for use in embodiments disclosed herein is illustrated in FIG. 10. In the example of FIG. 10, a polar transmitter 1000 receives predistorted digital amplitude signal $A_{pd}$, and predistorted digital phase signal $\varphi_{pd}$. The phase signal $\varphi_{pd}$ is injected using phase injection circuitry 1002 into a phase-locked loop that includes a digitally-controlled oscillator (DCO) 1004. The phase injection circuitry 1002 compares the phase of the DCO output with the phase of identified by the phase signal $\varphi_{pd}$ and controls the DCO such that the phase of the DCO output more closely matches the phase of phase signal $\varphi_{pd}$. The DCO output is then amplified by power amplifier circuitry 1006, with the gain of the power amplifier circuitry 1006 being controlled by the predistorted digital amplitude signal $A_{pd}$. The radio-frequency output of the power amplifier circuitry 1006 is provided to an antenna for transmission. The output is further sampled by a coupler (120, 200) for use by adaptive predistortion circuitry (100, 200).

Figure 11:
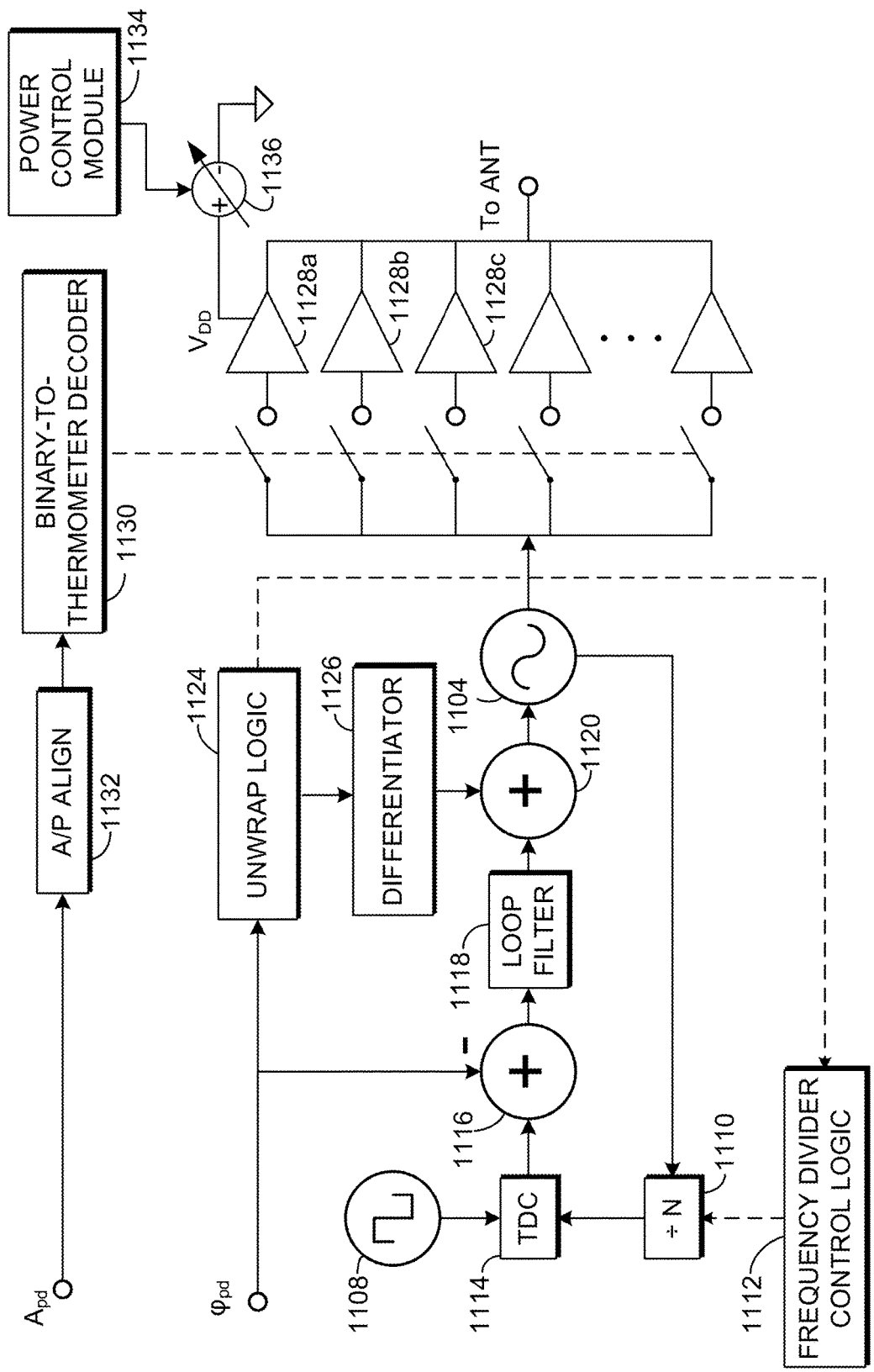
FIG. 11 is a schematic circuit diagram of another polar transmitter for use with a digital predistortion circuit according to an embodiment.

An exemplary polar transmitter architecture using a phase-locked loop is illustrated in greater detail in FIG. 11. In the embodiment of FIG. 11, a digital voltage controlled oscillator 1104 provides an oscillating signal to a frequency divider 1110, which divides the frequency of the oscillating signal from the oscillator 1104 by a frequency divisor N to generate a frequency-divided signal. In some embodiments, the frequency divider 1110 is a variable frequency divider, with the frequency divisor N being controlled by frequency divider control logic 1112. A multi-modulus frequency divider (MMD) may be implemented using, for example, a cascaded chain of ⅔ frequency divider sections.

A reference clock 1108 operates to provide a cyclic reference signal. A time-to-digital converter (TDC) 1114 is operative to compare the phase of the frequency-divided signal with the phase of the cyclic reference signal to generate a measured phase signal. The time-to-digital converter 1114 may operate by, for example, measuring an elapsed time between a rising edge of the cyclic reference signal and a rising edge of the frequency-divided signal.

Subtraction logic 1116 is provided to generate an error signal representing the difference between the phase measured by the TDC 1114 and the predistorted digital phase signal (Ppd. The error signal generated by the subtraction logic 1116 is filtered by a loop filter 1118, which may be a digital proportional-integral (PI) filter, to generate a filtered error signal. In some embodiments, a differential of the phase signal $\varphi_{pd}$ is generated by a differentiator 1126 and injected into the loop by adder 1120. To avoid large spikes in the differentiated signal (when, e.g. the phase signal shifts from near +π to near −π), the phase signal may be unwrapped using unwrap logic 1124 before differentiation. The operation of a phase-locked loop such as that used in the polar transmitter of FIG. 11 is described in greater detail in U.S. patent application Ser. No. 14/667,368, filed Mar. 24, 2015, entitled "WIDEBAND DIRECT MODULATION WITH TWO-POINT INJECTION IN DIGITAL PHASE LOCKED LOOPS," the entirety of which is incorporated herein by reference.

The output of the digitally-controlled oscillator 1104 is amplified by power amplifier circuitry that, in the example of FIG. 11, includes a plurality of power amplifier cells 1128a, 1128b, 1128c, etc. The amplitude of the signal output by the power amplifier circuitry is controlled by engaging a variable number of power amplifier cells to amplify the signal from the digitally-controlled oscillator 1104. Specifically, the amplitude of the radio frequency output signal of the polar transmitter is substantially proportional to the number or cells engaged to amplify the signal. The output signal amplitude may deviate from strict proportionality due to, for example, nonlinear distortion effects. A binary-to-thermometer decoder 1130 is provided to receive the digital predistorted amplitude signal $A_{pd}$ and convert the digital signal to a thermometer code that engages and disengages selected ones of the power amplifier cells to achieve the desired amplitude. To accommodate different time delays in the amplitude and phase transmission paths, amplitude/phase alignment logic 1132 is provided to align the signals.

In some embodiments, a power control circuit 1134 is provided to control the voltage $V_{DD}$ provided to the amplifier cells. Different drain voltages $V_{DD}$ may be selected for different transmission modes. Like the power control circuit 116 illustrated in FIG. 1, the power control circuit 1134 of FIG. 11 may provide an address input to a lookup table containing predistortion parameters. In the example of FIG. 11, the power control circuit 1134 digitally controls the output of a programmable voltage source 1136 that in turn provides drain voltages $V_{DD}$ to the amplifier cells 1128*a*, 1128*b*, 1128*c*, etc. The output of the power amplifier circuitry is coupled to an antenna for transmission and to a coupler for sampling by a polar receiver.

Digital Predistortion Methods.

Figure 12:
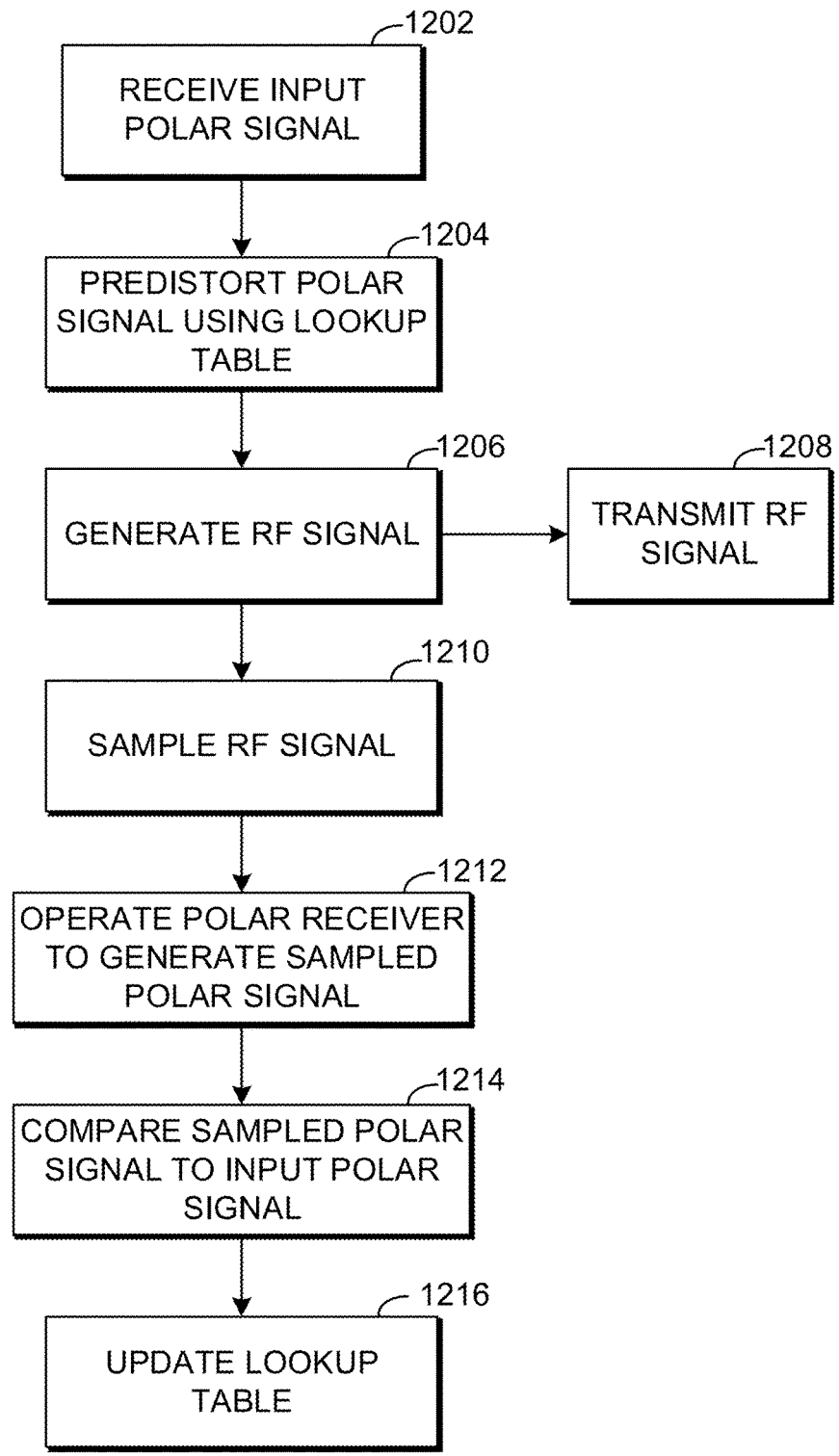
FIG. 12 is a flow chart of a digital predistortion method for use with a polar transmitter.

An exemplary digital predistortion method is illustrated in FIG. 12. In step 1202, digital predistortion circuitry receives an input polar signal that includes an input amplitude signal and an input phase signal. In step 1204, the circuitry predistorts the input polar signal using at least one predistortion parameter selected from a lookup table. In step 1206, the circuitry operates a polar transmitter to generate a phase-and-amplitude modulated radio-frequency signal corresponding to the predistorted polar signal. In step 1208, the radio-frequency signal is transmitted from an antenna.

In step 1210, a sample of the generated radio-frequency signal is provided to a polar receiver through a coupler. In step 1212, the polar receiver is operated to generate, from the copied radio-frequency signal, a sampled polar signal that includes a sampled amplitude signal and a sampled phase signal. In step 1214, the sampled polar signal is compared to the input polar signal. This comparison may be a comparison with a delayed version of the input polar signal. In step 1216, the lookup table is updated in response to the comparison.

In one embodiment, the method can further include amplifying the radio-frequency signal with a power amplifier using a selected power level, and the at least one predistortion parameter in the lookup table from step 1204 can be selected based in part on the selected power level.

In one embodiment, step 1204, predistorting the input polar signal, can include looking up an amplitude predistortion parameter corresponding to a value of the input amplitude signal andmultiplying the input amplitude signal by the amplitude predistortion parameter.

In another embodiment, step 1204, predistorting the input polar signal, can include looking up a phase predistortion parameter corresponding to a value of the input amplitude signal and adding the phase predistortion parameter to the input phase signal.

In another embodiment, step 1204, predistorting the input polar signal can also include looking up an amplitude predistortion parameter corresponding to a value of the input amplitude signal, multiplying the input amplitude signal by the amplitude predistortion parameter to generate a predistorted amplitude signal, looking up a phase predistortion parameter corresponding to a value of the predistorted amplitude signal; and adding the phase predistortion parameter to the input phase signal.

In one embodiment, step 1212, operating the polar receiver to generate the sampled phase signal further includes dividing the frequency of the copied radio-frequency signal to generate a frequency-divided signal and providing the frequency-divided signal to a time-to-digital converter. For example, dividing the frequency of the copied radio-frequency signal can include providing the copied radio-frequency signal to an injection-locked frequency divider.

In one embodiment, step 1212, operating the polar receiver to generate the sampled phase signal includes normalizing an amplitude of the copied radio-frequency signal and measuring the phase of the normalized radio-frequency signal.

In one embodiment, step 1214, comparing the sampled polar signal to the input polar signal includes comparing the sampled polar signal to a delayed version of the input polar signal.

In another embodiment, step 1214, comparing the sampled polar signal to the input polar signal can include subtracting the sampled phase signal from the input phase signal to determine a phase difference. Step 1216, in one embodiment, can include updating the lookup table through at least adjusting an entry in the lookup table by an amount proportional to the phase difference.

In one embodiment, step 1214, comparing the sampled polar signal to the input polar signal, can include subtracting the sampled amplitude signal from the input amplitude signal to determine an amplitude difference, and step 1216, updating the lookup table, can include at least adjusting an entry in the lookup table by an amount proportional to the amplitude difference.

Figure 13:
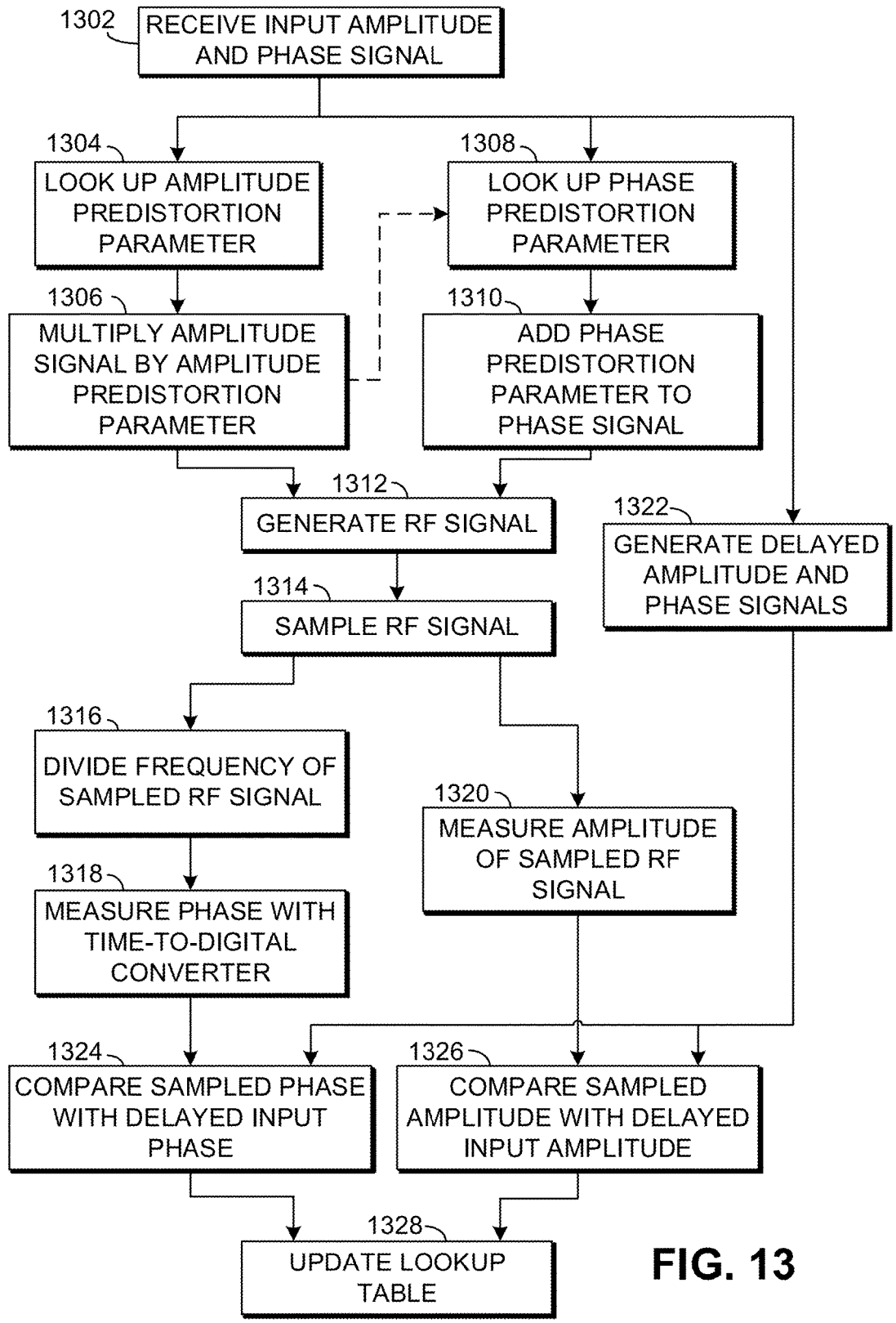
FIG. 13 is a flow chart of another digital predistortion method for use with a polar transmitter.

Another exemplary method is illustrated in FIG. 13. In step 1302, the digital predistortion logic receives an input phase and amplitude signal. In step 1304, the predistortion logic looks up an amplitude predistortion parameter in a lookup table based on the input amplitude signal. In step 1306, the input amplitude signal is multiplied by the selected amplitude predistortion parameter to generate a predistorted amplitude signal. In step 1308, a phase predistortion parameter is looked up in a lookup table. The phase predistortion parameter may be looked up based on the input amplitude signal or, in another embodiment, based on the predistorted amplitude signal. In step 1310, the phase predistortion parameter is added to the input phase signal.

In step 1312, a polar transmitter is operated to generate a radio-frequency signal corresponding to the predistorted amplitude and phase signals. The generation of the radio-frequency signal may include the use of a power amplifier or other components that introduce nonlinear distortions in the signal. To assist in the correction of these distortions, the radio-frequency signal is sampled in step 1314. The phase and amplitude of the copied radio-frequency signal are then measured using a polar receiver architecture. Along a phase detection path, in step 1316, the frequency of the copied radio-frequency signal is divided, using, e.g. an injection-locked frequency divider and, in some embodiments, a digital frequency divider. These frequency dividers further serve to normalize the amplitude of the sampled signal. In step 1318, the frequency-divided signal is provided to a time-to-digital converter, the output of which provides a representation of the phase of the copied radio frequency signal.

Along an amplitude detection path, the amplitude of the copied radio frequency signal is measured at step 1320. At step 1322, delayed amplitude and phase signals are generated by, for example, passing the input polar signal through a loop delay matching circuit. In step 1324, the sampled phase signal is compared with the delayed input phase signal. A difference between the two represents an uncorrected phase distortion. Similarly, in step 1326, the sampled amplitude signal is compared with the delayed input amplitude. A difference between the two represents an uncorrected amplitude distortion. In step 1328, the predistortion parameters in the lookup table are adjusted to better correct the detected distortion. For example, if the sampled phase lags the input phase, the corresponding phase predistortion parameter in the lookup table may be increased. If the sampled amplitude is lower than the input amplitude, the corresponding amplitude predistortion parameter in the lookup table may be increased. These increases (or corresponding decreases where necessary) may be made in increments that are sufficiently small such that the values of the parameters stably approach optimal values (although it is to be expected that the optimal values will be constantly changing due to changing conditions of use, such as variations in power supplies, temperature, and the like).

Note that various hardware elements of one or more of the described embodiments are referred to as "circuits" that carry out (i.e., perform, execute, and the like) various functions that are described herein in connection with the respective circuits. As used herein, a circuit includes hardware (e.g., circuits implemented in MOS transistors (NMOS, PMOS, CMOS, etc.), and in some cases deployed as an application-specific integrated circuits (ASICs), one or more field programmable gate arrays (FPGAs), or the like) deemed suitable by those of skill in the relevant art for a given implementation. Each described circuit may also include control inputs operating in conjunction with a control circuit the execute instructions associated with carrying out the one or more functions described as being carried out by the respective circuit, and it is noted that those instructions could take the form of or include hardware (i.e., hardwired) instructions, firmware instructions, software instructions, and/or the like, and may be stored in any suitable non-transitory computer-readable medium or media, such as commonly referred to as RAM, ROM, etc.

It should be noted that, as used in the present disclosure, the terms "connected," "coupled," and the like refer not only to immediate physical connection but also to connection through intermediate components such as, but not limited to, delay logic, couplers, modular dividers, bit truncation circuitry, buffers, multipliers, and the like.

In the foregoing specification, specific embodiments have been described. However, one of ordinary skill in the art appreciates that various modifications and changes can be made without departing from the scope of the invention as set forth in the claims below. Accordingly, the specification and figures are to be regarded in an illustrative rather than a restrictive sense, and all such modifications are intended to be included within the scope of present teachings.

The benefits, advantages, solutions to problems, and any element(s) that may cause any benefit, advantage, or solution to occur or become more pronounced are not to be construed as a critical, required, or essential features or elements of any or all the claims. The invention is defined solely by the appended claims including any amendments made during the pendency of this application and all equivalents of those claims as issued.

Moreover in this document, relational terms such as first and second, top and bottom, and the like may be used solely to distinguish one entity or action from another entity or action without necessarily requiring or implying any actual such relationship or order between such entities or actions. The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element. The terms "a" and "an" are defined as one or more unless explicitly stated otherwise herein. The terms "substantially", "essentially", "approximately", "about" or any other version thereof, are defined as being close to as understood by one of ordinary skill in the art, and in one non-limiting embodiment the term is defined to be within 10%, in another embodiment within 5%, in another embodiment within 1% and in another embodiment within 0.5%. The term "coupled" as used herein is defined as connected, although not necessarily directly and not necessarily mechanically. A device or structure that is "configured" in a certain way is configured in at least that way, but may also be configured in ways that are not listed.

It will be appreciated that some embodiments may be comprised of one or more generic or specialized processors (or "processing devices") such as microprocessors, digital signal processors, customized processors and field programmable gate arrays (FPGAs) and unique stored program instructions (including both software and firmware) that control the one or more processors to implement, in conjunction with certain non-processor circuits, some, most, or all of the functions of the method and/or apparatus described herein. Alternatively, some or all functions could be implemented by a state machine that has no stored program instructions, or in one or more application specific integrated circuits (ASICs), in which each function or some combinations of certain of the functions are implemented as custom logic. Of course, a combination of the two approaches could be used.

Moreover, an embodiment can be implemented as a computer-readable storage medium having computer readable code stored thereon for programming a computer (e.g., comprising a processor) to perform a method as described and claimed herein. Examples of such computer-readable storage mediums include, but are not limited to, a hard disk, a CD-ROM, an optical storage device, a magnetic storage device, a ROM (Read Only Memory), a PROM (Programmable Read Only Memory), an EPROM (Erasable Programmable Read Only Memory), an EEPROM (Electrically Erasable Programmable Read Only Memory) and a Flash memory. Further, it is expected that one of ordinary skill, notwithstanding possibly significant effort and many design choices motivated by, for example, available time, current technology, and economic considerations, when guided by the concepts and principles disclosed herein will be readily capable of generating such software instructions and programs and ICs with minimal experimentation.

The Abstract of the Disclosure is provided to allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in various embodiments for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separately claimed subject matter.

The invention claimed is:

1. A method comprising:
    receiving an input polar transmit signal including an input amplitude signal and an input phase signal;
    generating a predistorted polar transmit signal by predistorting the input polar transmit signal using at least one predistortion parameter selected from a lookup table;
    generating a phase-and-amplitude modulated radio-frequency transmit signal corresponding to the predistorted polar signal;
    providing a copy of the generated radio-frequency signal to a polar receiver having an injection lock oscillator (ILO);
    operating the ILO of the polar receiver to generate in response to the copied, generated radio-frequency signal, a sampled polar signal including a sampled amplitude signal and a sampled phase signal;
    comparing the sampled polar signal to the input polar transmit signal; and
    updating the lookup table in response to the comparison.

2. The method of claim 1, further comprising:
    amplifying the radio-frequency signal with a power amplifier using a selected power level, wherein the at least one predistortion parameter in the lookup table is selected based in part on the selected power level.

3. The method of claim 1, wherein predistorting the input polar transmit signal comprises:
    looking up an amplitude predistortion parameter corresponding to a value of the input amplitude signal; and
    multiplying the input amplitude signal by the amplitude predistortion parameter.

4. The method of claim 1, wherein predistorting the input polar transmit signal comprises:
    looking up a phase predistortion parameter corresponding to a value of the input amplitude signal; and
    adding the phase predistortion parameter to the input phase signal.

5. The method of claim 1, wherein predistorting the input polar transmit signal comprises:
    looking up an amplitude predistortion parameter corresponding to a value of the input amplitude signal;
    multiplying the input amplitude signal by the amplitude predistortion parameter to generate a predistorted amplitude signal;
    looking up a phase predistortion parameter corresponding to a value of the predistorted amplitude signal; and
    adding the phase predistortion parameter to the input phase signal.

6. The method of claim 1, wherein operating the polar receiver to generate the sampled phase signal includes:
    dividing the frequency of the copied radio-frequency signal to generate a frequency-divided signal; and
    providing the frequency-divided signal to a time-to-digital converter.

7. The method of claim 6, wherein dividing the frequency of the copied radio-frequency signal includes providing the copied radio-frequency signal to an injection-locked frequency divider.

8. The method of claim 1, wherein operating the polar receiver to generate the sampled phase signal includes:
    normalizing an amplitude of the copied radio-frequency signal; and
    measuring the phase of the normalized radio-frequency signal.

9. The method of claim 1, wherein comparing the sampled polar signal to the input polar transmit signal comprises comparing the sampled polar signal to a delayed version of the input polar transmit signal.

10. The method of claim 1, wherein comparing the sampled polar signal to the input polar transmit signal comprises subtracting the sampled phase signal from the input phase signal to determine a phase difference, and wherein updating the lookup table includes adjusting an entry in the lookup table by an amount proportional to the phase difference.

11. The method of claim 1, wherein comparing the sampled polar signal to the input polar transmit signal comprises subtracting the sampled amplitude signal from the input amplitude signal to determine an amplitude difference, and wherein updating the lookup table includes adjusting an entry in the lookup table by an amount proportional to the amplitude difference.

12. A circuit comprising:
    a lookup table having at least one address input and a data output, the address input being connected to a polar signal input, the lookup table being operative to store a plurality of predistortion parameters;
    predistortion logic having at least a first predistortion input connected to the polar signal input and a second predistortion input connected to the data output of the lookup table, the predistortion logic further having a predistortion output;
    a polar transmitter having an input connected to the predistortion output, the polar transmitter having an RF output;
    a polar receiver having an RF input coupled to the RF output of the polar transmitter, the polar receiver having a sampled polar signal output; and
    an adaptation circuit having a first input connected to the sampled polar signal output of the polar receiver and a second input connected to the polar signal input, the adaptation circuit being operative to modify the stored predistortion parameters based on a comparison of the sampled polar signal output with the polar signal input.

13. The circuit of claim 12, wherein the predistortion output includes a predistorted amplitude output, and wherein at least one of the address inputs of the lookup table is connected to the predistorted amplitude output.

14. The circuit of claim 12, wherein the polar receiver includes a phase detector and an envelope detector, and wherein the phase detector includes amplitude normalization circuitry.

15. The circuit of claim 12, wherein the polar receiver includes a phase detector and an envelope detector, and wherein the phase detector comprises:
    a frequency divider having a frequency-divided output and an input connected to the RF input of the polar receiver; and a time-to-digital converter connected to the frequency-divided output and operative to determine a sampled phase signal from a phase of the frequency-divided output.

16. The circuit of claim 15, wherein the frequency divider is an injection-locked frequency divider.

17. The circuit of claim 12, wherein the polar transmitter includes a power amplifier, and wherein the power amplifier comprises:
   a binary-to-thermometer decoder having a plurality of thermometer code outputs and a binary input connected to the predistortion output; and
   a plurality of power amplifier cells connected to respective thermometer code outputs.

18. The circuit of claim 12, further comprising a power control circuit having a power level output operative to control a drain voltage level applied to the plurality of power amplifier cells.

19. The circuit of claim 12, wherein the polar transmitter includes a power amplifier, the circuit further comprising a power control circuit having a power level output operative to control a power level of the power amplifier, wherein the power level output is connected to at least one of the address inputs of the lookup table.

20. The circuit of claim 12, further comprising a loop delay matching circuit to connect the polar signal input to the lookup table and the adaptation circuit.

* * * * *